United States Patent
Toh et al.

(10) Patent No.: US 9,960,115 B1
(45) Date of Patent: May 1, 2018

(54) HEAT DISSIPATION AND SERIES RESISTANCE REDUCTION OF PA AND RF SWITCH IN SLT BY BACKSIDE THICK METAL

(71) Applicant: GLOBALFOUNDRIES Singapore Pte. Ltd., Singapore (SG)

(72) Inventors: Rui Tze Toh, Singapore (SG); Shyam Parthasarathy, Singapore (SG); Shaoqiang Zhang, Singapore (SG); Kouassi Sebastien Kouassi, Singapore (SG); Bo Yu, Singapore (SG); Raj Verma Purakh, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days. days.

(21) Appl. No.: 15/640,928

(22) Filed: Jul. 3, 2017

(51) Int. Cl.
*H01L 29/40* (2006.01)
*H01L 23/522* (2006.01)
*H01L 21/768* (2006.01)
*H01L 27/12* (2006.01)
*H01L 23/532* (2006.01)

(52) U.S. Cl.
CPC ...... *H01L 23/5226* (2013.01); *H01L 21/7684* (2013.01); *H01L 21/76883* (2013.01); *H01L 23/53214* (2013.01); *H01L 23/53228* (2013.01); *H01L 23/53257* (2013.01); *H01L 27/1203* (2013.01)

(58) Field of Classification Search
CPC ................. H01L 23/34; H01L 23/36; H01L 21/7624–21/76291; H01L 27/1203–27/1211
See application file for complete search history.

(56) References Cited

U.S. PATENT DOCUMENTS

2014/0342529 A1  11/2014 Goktepeli et al.

*Primary Examiner* — Selim Ahmed
*Assistant Examiner* — Evan Clinton
(74) *Attorney, Agent, or Firm* — Ditthavong & Steiner, P.C.

(57) ABSTRACT

Methods of forming a SOI PA and RF switch device having a thin BOX layer in the PA power cell region and a thick metal layer directly under the thin BOX layer and the resulting device are provided. Embodiments include providing a SOI structure having a substrate, BOX, device and metallization layers; bonding a handling layer to the metallization layer; removing the substrate; forming a passivation oxide layer over the BOX; forming first and second trenches through the passivation, BOX, and device layers down to the metallization layer; forming a third trench through the passivation layer and a portion of the BOX above a PA power cell region of the SOI structure, a thin portion of the BOX remaining; forming a first backside contact in the first trench; and forming a second backside contact in the second and third trenches and over a portion of the passivation oxide layer.

20 Claims, 8 Drawing Sheets

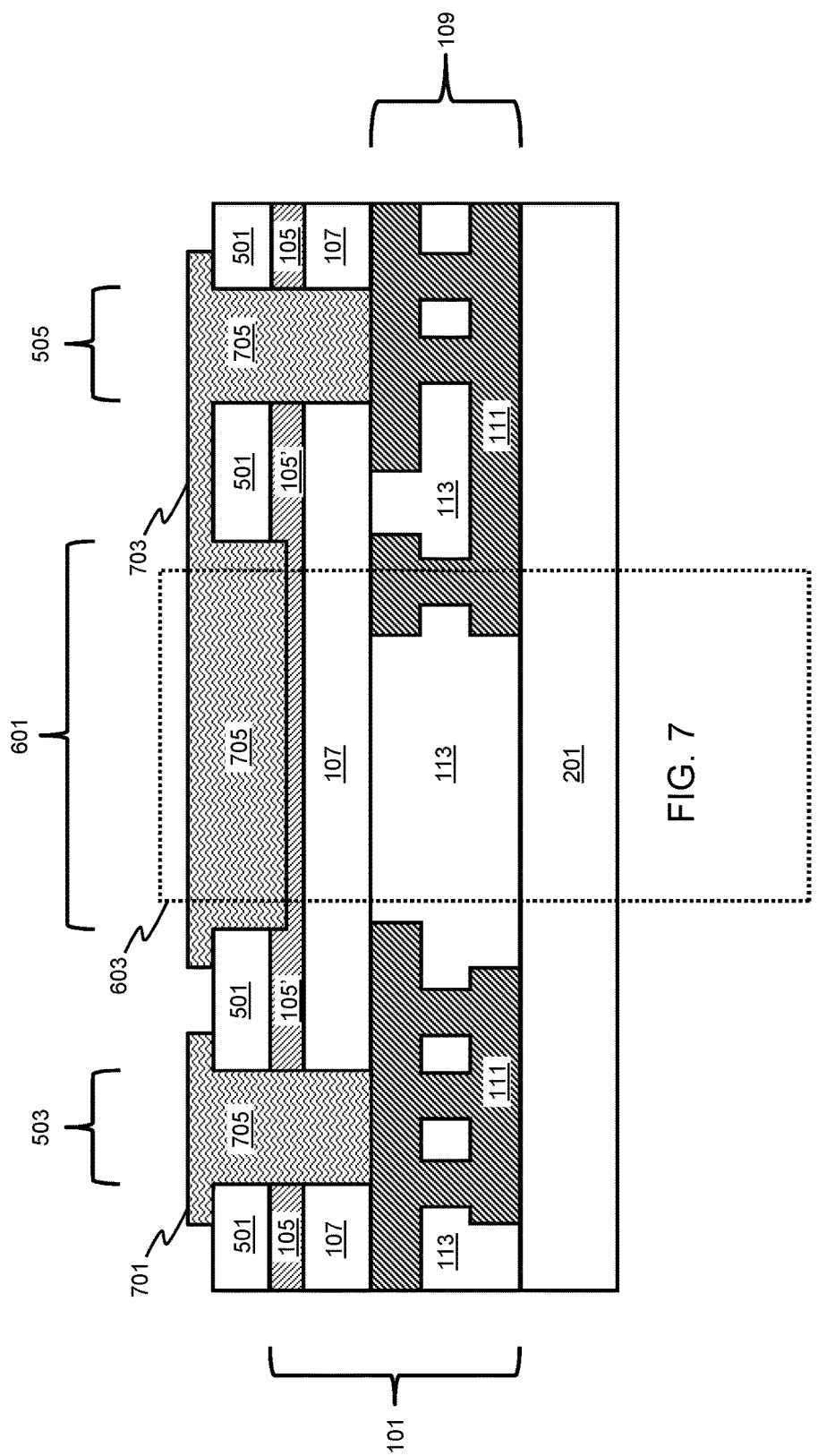

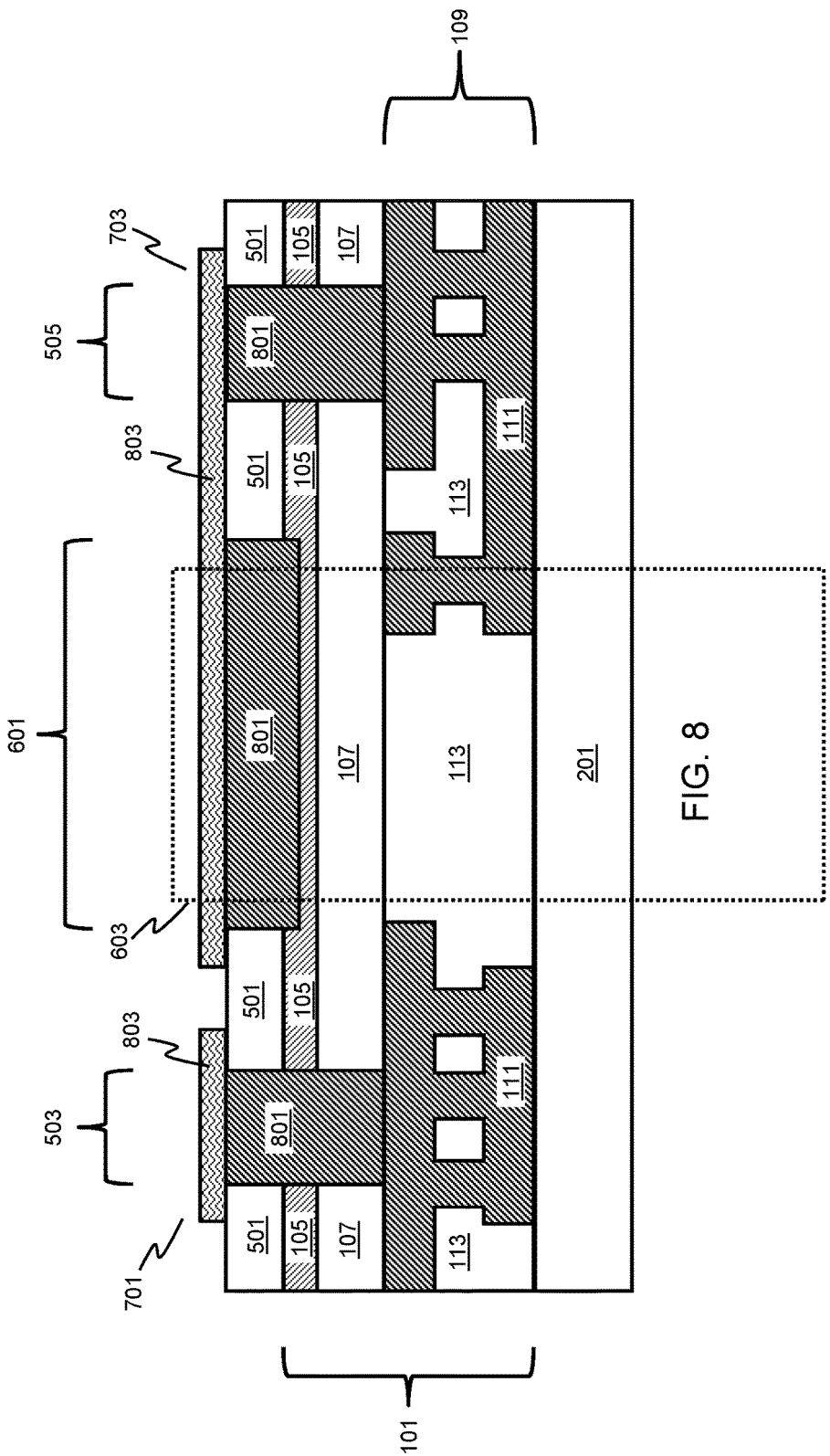

HEAT DISSIPATION AND SERIES RESISTANCE REDUCTION OF PA AND RF SWITCH IN SLT BY BACKSIDE THICK METAL

TECHNICAL FIELD

The present disclosure relates to methods of manufacturing semiconductor-on-insulator (SOI) devices. The present disclosure is particularly applicable to SOI devices with a power amplifier (PA) and a radio frequency (RF) switch.

BACKGROUND

Known single layer transfer (SLT) processes can be modified to improve the performance of RF switch and PA processes within SOI technology. On SOI technology, PA performance is limited by self-heating. A thinner rather than a thicker buried oxide (BOX) layer is better for power dissipation. The placement of a thick metal layer directly under the BOX layer may also improve heat dissipation. However, an RF switch benefits from a thicker rather than a thinner BOX layer to achieve a better off-capacitance/BOX capacitance ($C_{off}/C_{BOX}$) ratio.

A need therefore exists for methodology enabling selective thinning of the BOX layer and deposition of a thick metal layer in the PA power cell region without reducing the $C_{off}/C_{BOX}$ ratio of the RF switch and the resulting device.

SUMMARY

An aspect of the present disclosure is method of forming a SOI PA and RF switch device having a thin BOX layer in the PA power cell region and a thick metal layer directly under the thin BOX layer.

Another aspect of the present disclosure is a SOI PA and RF switch device including a thin BOX layer in the PA power cell region and a thick metal layer directly under the thin BOX layer.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a SOI structure having a sequentially formed substrate layer, BOX layer, device layer, and metallization layer; bonding a handling layer to an upper surface of the metallization layer; removing the substrate layer; forming a passivation oxide layer over the BOX layer; forming first and second trenches laterally separated through the passivation oxide, BOX, and device layers down to metal wiring of the metallization layer; forming a third trench through the passivation oxide layer and a portion of the BOX layer between the first and second trenches and above a PA power cell region of the SOI structure, a thin portion of the BOX layer remaining; forming a first backside metal contact in the first trench and over a portion of the passivation oxide layer; and forming a second backside metal contact in the second and third trenches and over a portion of the passivation oxide layer.

Aspects of the present disclosure include the metallization layer having the metal wiring and a passivation nitride fill. Other aspects include the substrate being removed by a series of grinding and wet etching. Further aspects include forming the third trench to a depth of 5000 angstrom (Å) to 60000 Å. Another aspect includes the thin portion of the BOX layer having a thickness of 50 Å to 1000 Å. Additional aspects include forming the first and second backside metal contacts by: filling the first, second, and third trenches with aluminum (Al) or tungsten (W); and etching portions of the Al or W down to the passivation oxide layer. Other aspects include forming the first and second backside metal contacts by: filling the first, second, and third trenches with Cu; planarizing the Cu down the passivation oxide layer; forming an Al or W layer over the Cu and passivation oxide layer; and etching portions of the Al or W down to the passivation oxide layer. Further aspects include connecting the second backside metal contact within the PA power cell region to a ground node by a redistribution layer (RDL).

Another aspect of the present disclosure is a device including: a metallization layer over a substrate; a device layer over the metallization layer; a BOX layer over the device layer, the BOX layer having a thin portion in a PA power cell region of the device and thick portions on opposite sides of the thin portion; a passivation oxide layer over the thick portions of the BOX layer; a pair of backside metal contacts laterally separated, each contact through the device layer, thick portions of the BOX layer, and passivation layer down to metal wiring of the metallization layer, and one contact having a thick metal layer over the thin portion of the BOX layer.

Aspects of the device include the metallization layer having the metal wiring and a passivation nitride fill. Other aspects include the thin portion of the BOX layer having a thickness of 50 Å to 1000 Å. Further aspects include the thick metal layer having a thickness of 2000 Å to 60000 Å. Additional aspects include each backside metal contact having a thickness of 1 μm to 6 μm above an upper surface of the passivation oxide layer. Another aspect includes each backside metal contact having an Al or W via and an Al or W contact pad and the thick metal layer being Al or W, respectively. Other aspects include each backside metal contact having a Cu via and an AL or W contact pad and the thick metal layer being Cu. Further aspects include the one contact being shorted to a ground node by a RDL.

A further aspect of the present disclosure is a method including: providing a SOI structure having a sequentially formed substrate, BOX layer, device layer, and a metallization layer including Cu circuitry and a passivation nitride fill; bonding a glass layer to an upper surface of the metallization layer; removing the substrate by a series of grinding and wet etching; forming a passivation oxide layer over the BOX layer; forming first and second trenches laterally separated through the passivation oxide, BOX, and device layers down to the Cu wiring; forming a third trench to a depth of 5000 Å to 60000 Å through the passivation oxide layer and a portion of the BOX layer between the first and second trenches and above a PA power cell region of the SOI structure until 50 Å to 1000 Å of the BOX layer in the PA power cell region remains; and forming a first backside metal contact in the first trench and over a portion of the passivation oxide layer; and forming a second backside metal contact in the second and third trenches and over a portion of the passivation oxide layer.

Aspects of the present disclosure include forming the first and second backside metal contacts by: filling the first, second, and third trenches with Al or W; and etching portions of the Al or W down to the passivation oxide layer. Other aspects include forming the first and second backside metal contacts by: filling the first, second, and third trenches with Cu; planarizing the Cu down the passivation oxide layer; forming an Al or W layer over the Cu and passivation oxide layer; and etching portions of the Al or W down to the passivation oxide layer. Further aspects include connecting the second backside metal contact within the PA power cell region to a ground node by a RDL.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1 through 8 schematically illustrate cross-sectional views of a process flow for forming a SOI PA and RF switch device having a thin BOX layer in the PA power cell region and a thick metal layer directly under the thin BOX layer, in accordance with an exemplary embodiment.

DETAILED DESCRIPTION

Figure 1:
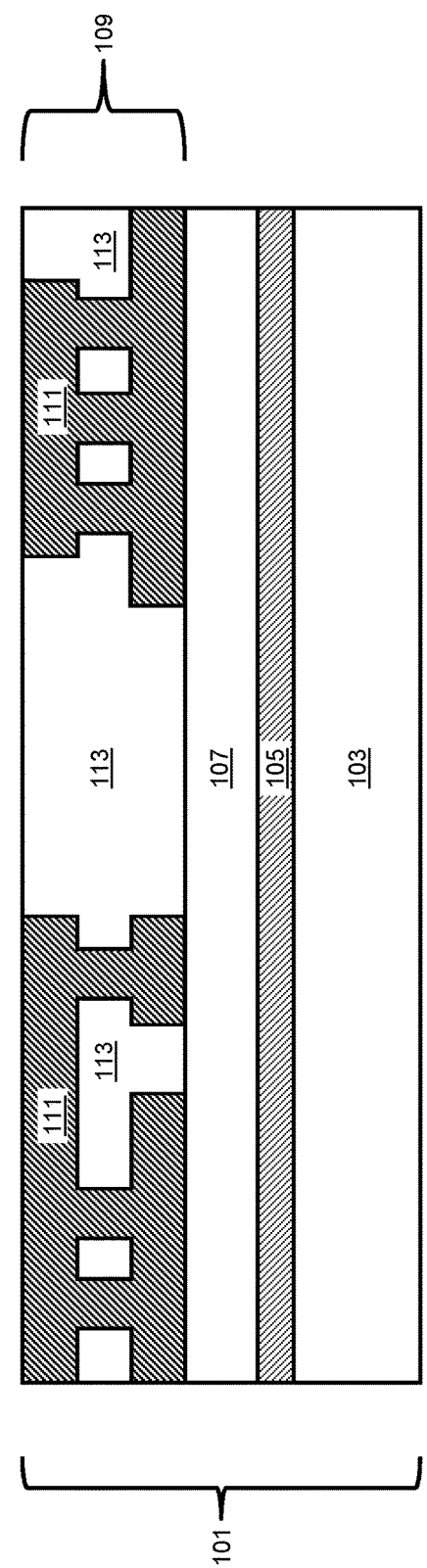

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of BOX layer scaling trade-offs between RF switch and PA devices; poor power cell heat dissipation, reliability, and performance for the PA device; and source inductance attendant upon forming a SOI PA and RF switch device. The problems are solved, inter alia, by forming a thin BOX layer in the PA power cell region and a thick metal layer directly under the thin BOX layer.

Methodology in accordance with embodiments of the present disclosure includes providing a SOI structure having a sequentially formed substrate layer, BOX layer, device layer, and metallization layer. A handling layer is bonded to an upper surface of the metallization layer and the substrate layer is removed. A passivation oxide layer is formed over the BOX layer and first and second trenches are formed laterally separated through the passivation oxide, BOX, and device layers down to metal wiring of the metallization layer. A third trench is formed through the passivation oxide layer and a portion of the BOX layer between the first and second trenches and above a PA power cell region of the SOI structure, a thin portion of the BOX layer remaining. A first backside metal contact is formed in the first trench and over a portion of the passivation oxide layer and a second backside metal contact is formed in the second and third trenches and over a portion of the passivation oxide layer.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 1 through 8 schematically illustrate cross-sectional views of a process flow for forming a SOI PA and RF switch device having a thin BOX layer in the PA power cell region and a thick metal layer directly under the thin BOX layer, in accordance with an exemplary embodiment. Adverting to FIG. 1, a SOI structure 101 is provided having an SOI substrate 103, a BOX layer 105, a device layer 107, and a metallization layer 109 including metal circuitry 111, e.g., formed of Cu, and a passivation oxide fill 113. The BOX layer 105 may have a thickness, e.g., of 0.2 µm to 1 µm, and a thicker BOX layer is generally preferred to achieve a better $C_{off}/C_{BOX}$ ratio.

Figure 2:
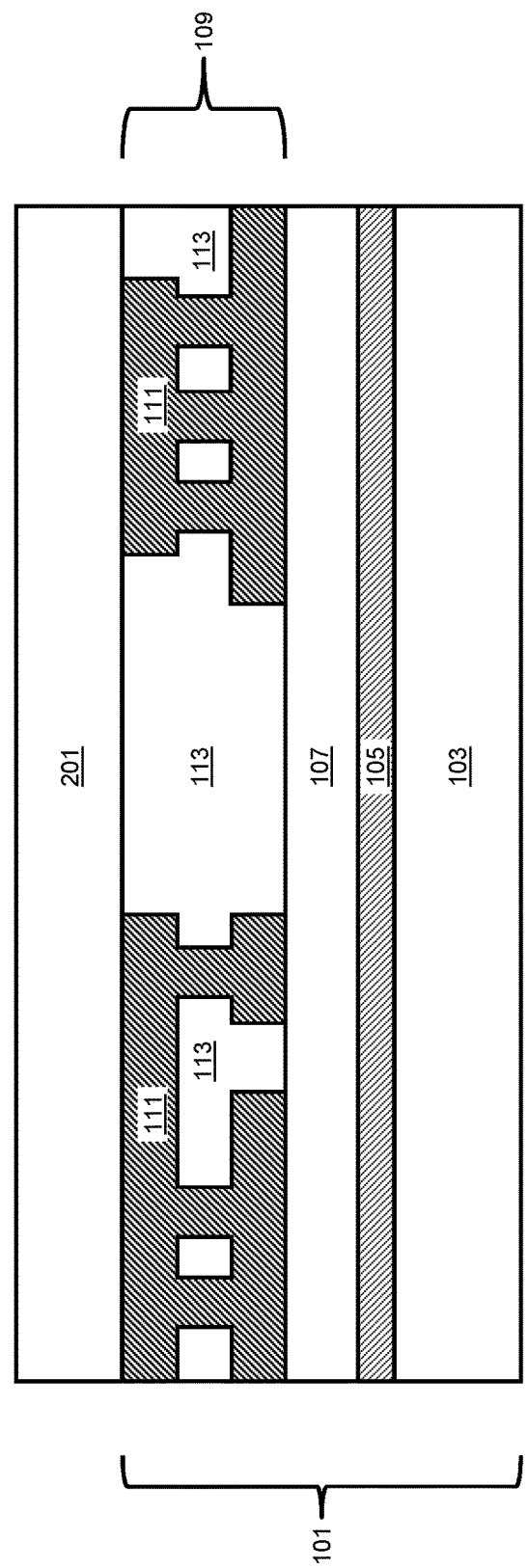
Figure 3:
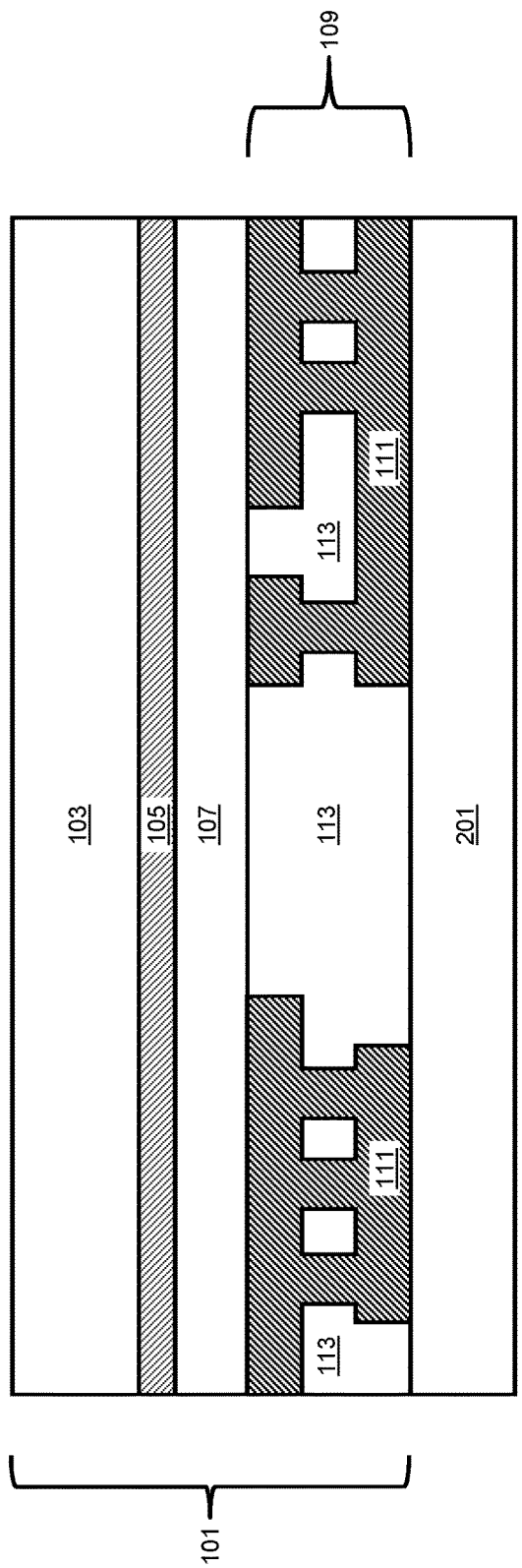
Figure 4:
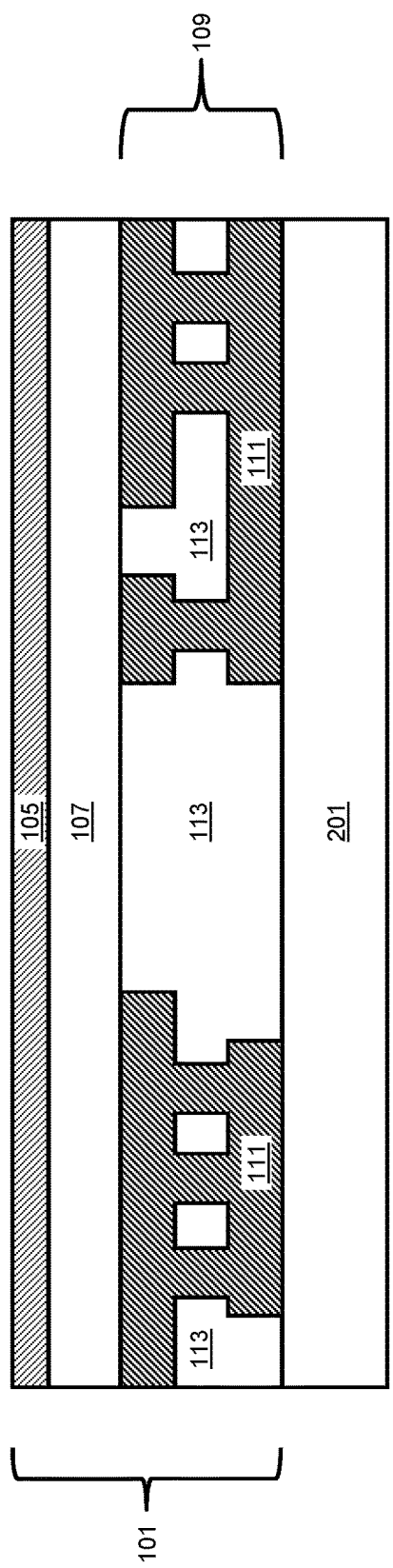

Following a known SLT process flow, a handling layer 201, e.g., formed of glass, is bonded to the upper surface of the metallization layer 109, as depicted in FIG. 2. Adverting to FIG. 3, the bonded SOI structure 101 and handling layer 201 are flipped so that the SOI substrate 103 may be removed, e.g., by a series of grinding and wet etchings using etchants such as potassium hydroxide (KOH), tetramethylammonium hydroxide (TMAH), hydrochloric acid (HCl), or other wet silicon (Si) etchants, as depicted in FIG. 4.

Figure 5:
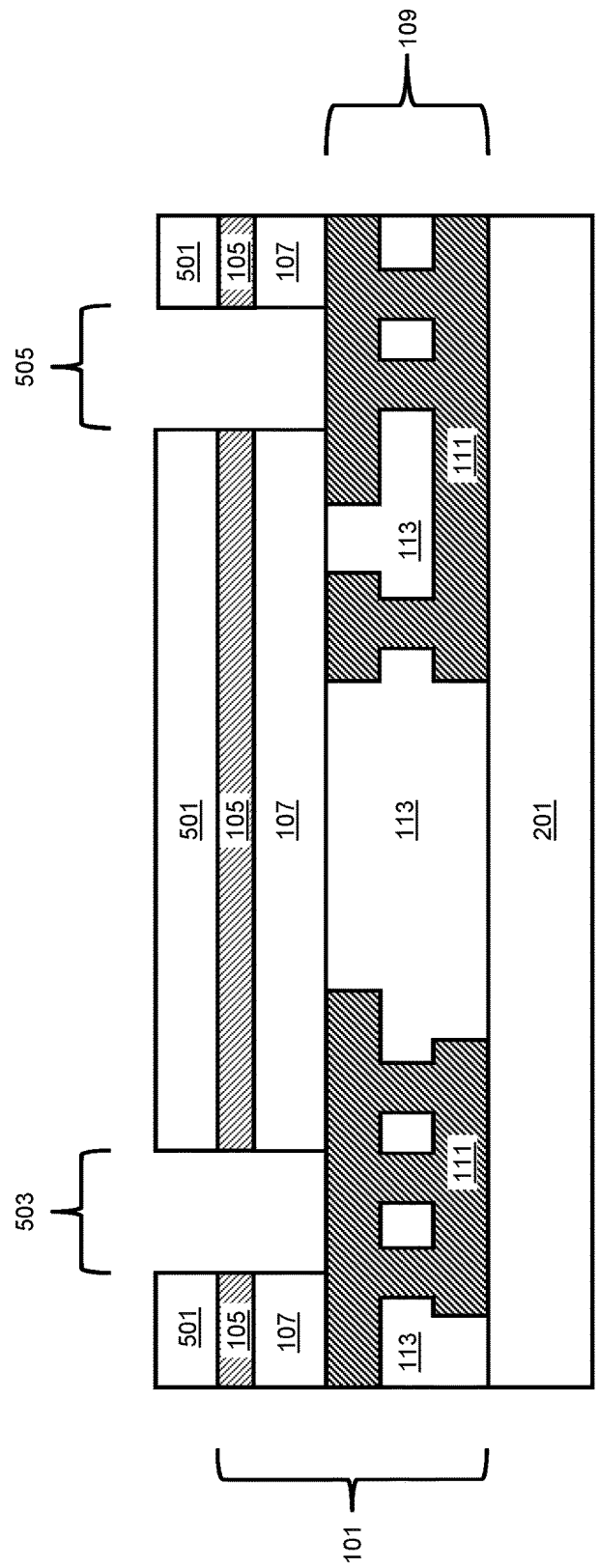
Figure 6:
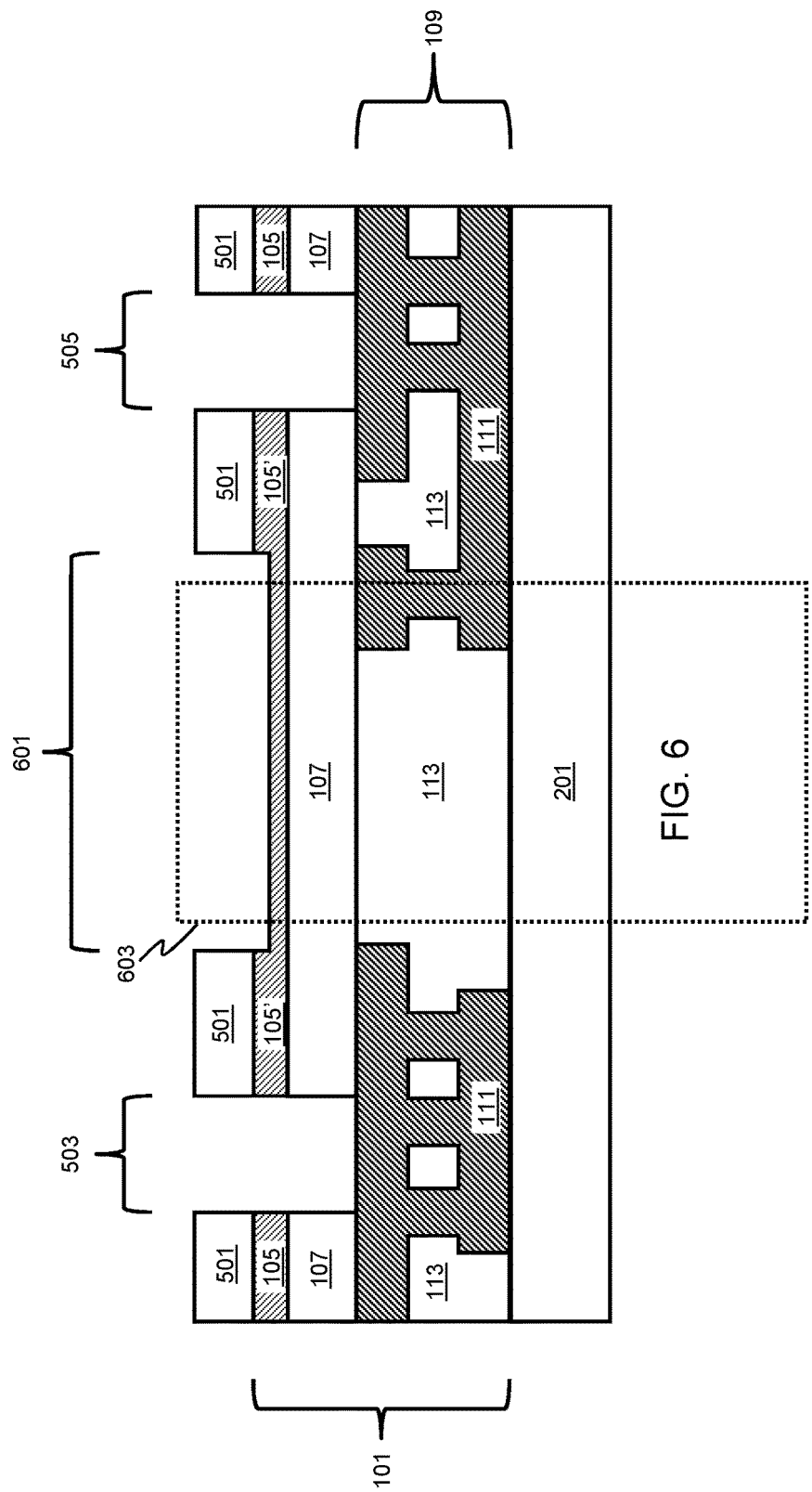

Adverting to FIG. 5, a passivation oxide layer 501 is formed, for example, to a thickness of 0.5 µm to 6 µm, e.g., 1 µm, over the BOX layer 105 and then laterally separated trenches 503 and 505 are each formed, e.g., to a width of 2 µm to 10s of µm by etching, through the passivation oxide layer 501, the BOX layer 105, and the device layer 107 down to the metal wiring 111 of the metallization layer 109. Adverting to FIG. 6, a trench 601 is then formed, e.g., to a depth of 5000 Å to 60000 Å, through the passivation oxide layer 501 and a portion of the BOX layer 105 above a PA power cell region as depicted by the line 603. Consequently, a thin portion of the BOX layer 105, for example, having a thickness of 50 Å to 1000 Å, e.g., 200 Å, remains thereafter, forming the BOX layer 105' in the PA power cell region.

Next, backside metal contacts 701 and 703 are formed in the trenches 503 and 505 and 601, respectively, and over portions of the passivation oxide layer 501, as depicted in FIG. 7. The backside metal contacts 701 and 703 may be formed, e.g., by filling the trenches 503, 505, and 601 with an Al or W layer 705, e.g., to a height of 1 µm to 6 µm above the upper surface of the passivation oxide layer 501, and then etching portions of the Al or W layer 705 down to the passivation oxide layer 501.

Adverting to FIG. 8, the backside metal contacts 701 and 703 may alternatively be formed, e.g., by filling the trenches 503, 505, and 601 with a Cu layer 801; planarizing the Cu layer 801 down to the passivation layer oxide layer 501; forming an Al or W layer 803, e.g., with a thickness of 1 µm to 6 µm, over the Cu layer 801 and passivation oxide layer 501; and then etching portions of the Al or W layer 803 down to the passivation oxide layer 501.

In both FIGS. 7 and 8, the portion of the backside metal contact 703 below the upper surface of the passivation oxide layer 501 in the PA power cell region (depicted by the line 603) has a thickness, e.g., of 2000 Å to 60000 Å. Consequently, in both FIGS. 7 and 8, the BOX layer 105' in the PA power cell region is thinner than the BOX layer 105 in other areas of the SOI device, e.g., within the RF switch region, and is brought in close contact with the thick metal portion of the backside metal contact 703, thus improving heat dissipation relative to known processes. The thick metal layer 705 or 801 of FIGS. 7 and 8, respectively, may also be used, e.g., as a field plate, to ground the device, or even back-bias the device to improve its performance. In addition, the backside metal contact 703 may also be shorted to a ground node by an RDL layer (not shown for illustrative convenience) to reduce source inductance, thus indirectly improving PA device stability and reliability. Moreover, the resulting devices of FIGS. 7 and 8 are similar, except by using the thick metal layer 801 as the RDL via in FIG. 8, the resulting device of FIG. 8 is more effective than the device of FIG. 7 in terms of heat dissipation and improving device performance.

The embodiments of the present disclosure can achieve several technical effects including avoiding BOX layer scaling trade-offs between RF switch and PA devices; improving PA power cell heat dissipation and reliability; better grounding of the PA power cell by adding a field plate on top of a very thin BOX layer; inductance minimization when the field plate is shorted to the PA power cell source; and boosting device performance with back-biasing of the device. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore has industrial applicability in any SOI devices with PA and RF switch devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   providing a semiconductor-on-insulator (SOI) structure having a sequentially formed substrate layer, buried oxide (BOX) layer, device layer, and metallization layer;
   bonding a handling layer to an upper surface of the metallization layer;
   removing the substrate layer;
   forming a passivation oxide layer over the BOX layer;
   forming first and second trenches laterally separated through the passivation oxide, BOX, and device layers down to metal wiring of the metallization layer;
   forming a third trench through the passivation oxide layer and a portion of the BOX layer between the first and second trenches and above a power amplifier (PA) power cell region of the SOI structure, a thin portion of the BOX layer remaining;
   forming a first backside metal contact in the first trench and over a portion of the passivation oxide layer; and
   forming a second backside metal contact in the second and third trenches and over a portion of the passivation oxide layer.

2. The method according to claim 1, wherein the metallization layer comprises the metal wiring and a passivation nitride fill.

3. The method according to claim 1, wherein the substrate is removed by a series of grinding and wet etching.

4. The method according to claim 1, comprising forming the third trench to a depth of 5000 angstrom (Å) to 60000 Å.

5. The method according to claim 1, wherein the thin portion of the BOX layer comprises a thickness of 50 Å to 1000 Å.

6. The method according to claim 1, comprising forming the first and second backside metal contacts by:
   filling the first, second, and third trenches with aluminum (Al) or tungsten (W); and
   etching portions of the Al or W down to the passivation oxide layer.

7. The method according to claim 1, comprising forming the first and second backside metal contacts by:
   filling the first, second, and third trenches with Cu;
   planarizing the Cu down the passivation oxide layer;
   forming an Al or W layer over the Cu and passivation oxide layer; and
   etching portions of the Al or W down to the passivation oxide layer.

8. The method according to claim 1, further comprising connecting the second backside metal contact within the PA power cell region to a ground node by a redistribution layer (RDL).

9. A device comprising:
   a metallization layer over a substrate;
   a device layer over the metallization layer;
   a buried oxide (BOX) layer over the device layer, the BOX layer having a thin portion in a power amplifier (PA) power cell region of the device and thick portions on opposite sides of the thin portion;
   a passivation oxide layer over the thick portions of the BOX layer;
   a pair of backside metal contacts laterally separated, each contact through the device layer, thick portions of the BOX layer, and passivation layer down to metal wiring of the metal layer, and one contact having a thick metal layer over the thin portion of the BOX layer.

10. The device according to claim 9, wherein the metallization layer comprises the metal wiring and a passivation nitride fill.

11. The device according to claim 9, wherein the thin portion of the BOX layer comprises a thickness of 50 angstrom (Å) to 1000 Å.

12. The device according to claim 9, wherein the thick metal layer comprises a thickness of 2000 Å to 60000 Å.

13. The device according to claim 9, wherein each backside metal contact comprises a thickness of 1 micrometer (μm) to 6 μm above an upper surface of the passivation oxide layer.

14. The device according to claim 9, wherein each backside metal contact comprises an (Al) or tungsten (W) via and an Al or W contact pad and the thick metal layer comprises Al or W layer, respectively.

15. The device according to claim 9, wherein each backside metal contact comprises a Cu via and an AL or W contact pad and the thick metal layer comprises Cu.

16. The device according to claim 9, further comprising the one contact being shorted to a ground node by a redistribution layer (RDL).

17. A method comprising:
providing a semiconductor-on-insulator (SOI) structure having a sequentially formed substrate, buried oxide (BOX) layer, device layer, and a metallization layer including copper (Cu) wiring and a passivation nitride fill;
bonding a glass layer to an upper surface of the metallization layer;
removing the substrate by a series of grinding and wet etching;
forming a passivation oxide layer over the BOX layer;
forming first and second trenches laterally separated through the passivation oxide, BOX, and device layers down to the Cu wiring;
forming a third trench to a depth of 5000 angstrom (Å) to 60000 Å through the passivation oxide layer and a portion of the BOX layer between the first and second trenches and above a power amplifier (PA) power cell region of the SOI structure until 50 Å to 1000 Å of the BOX layer in the PA power cell region remains; and
forming a first backside metal contact in the first trench and over a portion of the passivation oxide layer; and
forming a second backside metal contact in the second and third trenches and over a portion of the passivation oxide layer.

18. The method according to claim 17, comprising forming the first and second backside metal contacts by:
filling the first, second, and third trenches with aluminum (Al) or tungsten (W); and
etching portions of the Al or W down to the passivation oxide layer.

19. The method according to claim 17, comprising forming the first and second backside metal contacts by:
filling the first, second, and third trenches with Cu;
planarizing the Cu down the passivation oxide layer;
forming an Al or W layer over the Cu and passivation oxide layer; and
etching portions of the Al or W down to the passivation oxide layer.

20. The method according to claim 17, further comprising connecting the second backside metal contact within the PA power cell region to a ground node by a redistribution layer (RDL).

* * * * *